US005576730A

United States Patent [19]

Shimada et al.

[11] Patent Number: 5,576,730

[45] Date of Patent: Nov. 19, 1996

[54] ACTIVE MATRIX SUBSTRATE AND A METHOD FOR PRODUCING THE SAME

[75] Inventors: Takayuki Shimada, Ikoma-gun; Toshihiro Yamashita; Yutaka Takafuji, both of Nara, all of Japan

[73] Assignee: Sharp Kabushiki Kaisha, Osaka, Japan

[21] Appl. No.: 43,384

[22] Filed: Apr. 6, 1993

[30] Foreign Application Priority Data

Apr. 8, 1992 [JP] Japan .................................... 4-087283

[51] Int. Cl.$^6$ .................................................... G01R 31/28

[52] U.S. Cl. ............................ 345/98; 345/904; 324/770

[58] Field of Search ................................. 345/87, 50, 90, 345/98, 117, 904, 98, 100, 99; 359/57, 59, 87, 88; 324/158.1, 158 R, 678, 658, 537, 770

[56] References Cited

U.S. PATENT DOCUMENTS 4,857,907 8/1989 Koden .................................... 340/784
4,940,934 7/1990 Kawaguchi et al. .................... 345/905
5,057,775 10/1991 Hall .................................... 324/158 R
5,061,920 10/1991 Nelson ...................................... 345/98
5,095,304 3/1992 Young ....................................... 345/98
5,113,134 5/1992 Plus et al. .............................. 345/904
5,179,345 1/1993 Jenkins et al. .......................... 324/678
5,184,082 2/1993 Nelson .................................... 345/904
5,233,448 8/1993 Wu .......................................... 345/904
5,262,720 11/1993 Senn et al. .......................... 324/158 R
5,323,107 6/1994 D'Souza .............................. 324/158.1
5,341,012 8/1994 Misawa et al. .......................... 359/59

FOREIGN PATENT DOCUMENTS 1-36118 7/1989 Japan .

*Primary Examiner*—Steven Saras
*Attorney, Agent, or Firm*—Nixon & Vanderhye

[57] ABSTRACT

An active matrix substrate including an external signal supplying circuit for externally supplying the video signals to the data lines. The external signal supplying circuit includes a data line connection section connected to the data lines; an inspection signal inputting section and an inspection signal outputting section both connected to the data line connection section; and a switching device for electrically connecting the inspection signal inputting section or the inspection signal outputting section to the data line connection section. After the active matrix substrate is subjected to an electrical inspection, a short ring is formed for electrically connecting an inspection signal inputting terminal provided with an inspection signal inputting section, an inspection signal outputting terminal provided with an inspection signal outputting section, a first terminal provided with a gate driving circuit, a second terminal provided with a source driving circuit, and the data line connection section, in a case when the active matrix substrate is judged to have no defect; and then the short ring is removed after an alignment treatment of a display medium.

17 Claims, 7 Drawing Sheets

ACTIVE MATRIX SUBSTRATE AND A METHOD FOR PRODUCING THE SAME

BACKGROUND OF THE INVENTION

1. Field of the Invention

The present invention relates to an active matrix substrate having a driving circuit integrally formed therewith and used for a liquid crystal display device and the like, and a method for inspecting the same.

2. Description of the Related Art

A liquid crystal display device includes an active matrix substrate and a counter substrate opposed to the active matrix substrate with a liquid crystal layer interposed therebetween. A conventional active matrix substrate has a built-in driving circuit as is shown in FIG. 9. In FIG. 9, an active matrix substrate has a base panel 100, a plurality of gate bus lines 101 each acting as a scanning signal line, and a plurality of source bus lines 102 each acting as a data signal line. The gate bus lines 101 and the source bus lines 102 are provided on the base panel 100. The gate bus lines 101 and the source bus lines 102 intersect each other. Each intersection has a pixel capacitance 103 and a pixel transistor 104 as a switching device. In this manner, a plurality of the pixel capacitances 103 and a plurality of the pixel transistors 104 are arranged in a matrix, respectively. Each pixel transistor 104 has a gate electrode connected to the corresponding gate bus line 101, a source electrode connected to the corresponding source bus line 102, and a drain electrode connected to the corresponding pixel capacitance 103. Each pixel capacitance 103 is provided for retaining a video signal supplied thereto through the pixel transistor 104 as a signal charge.

The gate bus lines 101 are each connected to and also driven by a gate driving circuit 105. Among the pixel transistors 104 arranged in a matrix, one row of the pixel transistors 104 is connected to an identical gate bus line 101 and is simultaneously controlled to be on or off by the gate driving circuit 105. The gate driving circuit 105 is constituted by a shift register formed on the base panel 100, and is driven by an external power source and controlled by a start signal, a clock signal or the like externally supplied.

Each source bus line 102 is connected to one of three external signal lines 108 through an analog switch 107 which is controlled to be on or off by a source driving circuit 106.

Among the pixel transistors 104 arranged in a matrix, one column of the pixel transistors 104 is connected to an identical source bus line 102. In this manner, the source bus lines 102 are each connected to one column of the pixel capacitances 103 through the corresponding pixel transistors 104. In detail, each pixel capacitance 103 is connected to the corresponding pixel transistor 104 through one of two electrodes of the pixel capacitance 103. The source bus lines 102 are each connected to an additional capacitance 109 through one of two electrodes of the additional capacitance 109. The other electrode of the additional capacitance 109, which is not connected to the source bus line 102, and the other electrode of the pixel capacitance 103, which is not connected to the pixel transistor 104, are both connected to a wiring 110 and have an identical reference potential with each other.

The source driving circuit 106 is constituted by a shift register formed on the base panel 100, and is driven by an external power source and controlled by a start signal, a clock signal or the like externally supplied. In a case where the active matrix substrate is used for a liquid crystal display device, the three external signal lines 108 receive red, green and blue video signals, respectively, through an external terminal 120. A parasitic capacitance 111 is generated at each external signal line 108.

The active matrix substrate having the above-described configuration is operated in the following manner.

An ON signal is outputted from the gate driving circuit 105 to all the gate bus lines 101 sequentially, thereby turning on each row of the pixel transistors 104 connected to each gate bus line 101 which has received the ON signal. While the ON signal is being outputted to one gate bus line 101, an ON signal is outputted from the source driving circuit 106 to all the analog switches 107 sequentially, thereby turning on the analog switches 107. Then, the source bus line 102 connected to the analog switch 107 which has been turned on gets into connection with the corresponding external signal line 108. Thus, the pixel capacitance 103 connected to each pixel transistor 104 which has been turned on is applied with a signal charge through the source bus line 102.

The signal charge applied to the pixel capacitance 103 is maintained while the gate driving circuit 105 is outputting an ON signal to the gate bus lines 101 which do not correspond to this pixel capacitance 103, since the pixel transistor 104 corresponding to this pixel capacitance 103 is kept off. In this manner, the gate driving circuit 105 outputs an ON signal to all the gate bus lines 101. When a cycle of the above-described procedure is finished, namely, all the gate bus lines 101 have received an ON signal, the same procedure is repeated.

An optical transmittance of a liquid crystal layer depends on an effective voltage applied to each pixel capacitance 103 during one cycle. An improvement in the display quality of the liquid crystal display device is achieved by applying a sufficient level of signal charge to each pixel capacitance 103 and also reducing the amount of leak current to a minimum value so as to maintain the charge applied to the pixel capacitance 103.

The active matrix substrate gets into a drivable state as a part of a liquid crystal display device when combined with a counter substrate with a liquid crystal layer interposed therebetween. Once the active matrix substrate becomes drivable, an optical inspection for any defect can be performed. However, even if the active matrix substrate is judged to have a defect, the defect cannot be corrected unless the active matrix substrate is disassembled. Therefore, the process of assembling the active matrix substrates into a liquid crystal display device is wasted.

A method for electrically inspecting an active matrix substrate concerning operation of each pixel before the assembly into a liquid crystal display device is effective for improving the yield and reducing the product cost, since such a method, for example, eliminates unnecessary disassembly and reassembly process which would be necessary after the inspection with a conventional inspection method and allows the defect to be corrected relatively easily.

Such an electrical method is performed by use of an inspection apparatus shown in FIG. 10.

FIG. 10 is an equivalent circuit diagram for applying a charge corresponding to an inspection signal to one pixel capacitance 103 and detecting the level of the signal from the pixel capacitance 103. The inspection apparatus is connected to the external terminal 120 of the active matrix substrate. The inspection apparatus includes a switch 116 through which an inspection signal is inputted to the active matrix substrate, a switch 112 connected to the external terminal 120, a buffer 113 connected to the external terminal 120 through the switch 112, an A/D converter 114 for receiving a signal from the buffer 113, and a computer 115 for receiving a signal from the A/D converter 114.

The active matrix substrate is inspected in the following manner.

The switch 116 is turned on to supply the external terminal 120 with a certain potential as an inspection signal, and in this state, the gate driving circuit 105 and the source driving circuit 106 (FIG. 9) are driven. When one row of the pixel transistors 104 and the corresponding analog switches 107 are both turned on, a signal charge is sequentially applied to each of the pixel capacitances 103 corresponding to the pixel transistors 104 and the analog switches 107 which have been turned on. After the signal charge is kept for a certain period of time, the switch 112 is turned on to drive again the gate driving circuit 105 and the source driving circuit 106. When the same row of the pixel transistors 104 and the corresponding analog switches 107 are both turned on, the level of the signal corresponding to the signal charges which have been retained in the corresponding pixel capacitances 103 are sequentially detected through the external terminals 120, and amplified by the buffer 113 to be inputted to the computer 115 through the A/D converter 114. If an abnormality is generated with at least either one of the applying operation of the signal charge to the pixel capacitance 103 or the retaining operation of the signal charge in the pixel capacitance 103, the level of the signal corresponding to the signal charge is not detected. Thus, the active matrix substrate is judged to have a defect. Further, since the level of the signals are sequentially detected, the position where the defect exists can also be detected based on the timing and the distribution shape of the pulses of the detected signal. Such an inspecting method is proposed in, for example, Japanese Patent Publication No. 1-36118 and Japanese Laid-Open Patent Publication No. 64-9375.

In a conventional active matrix substrate, the pixel capacitance 103 is small compared with the additional capacitance 109 at the source bus line 102 and the parasitic capacitance 111 at the external signal line 108. Accordingly, the level of the signal charge to be detected is low, thus making it difficult to measure the level of the signal charge. For example, where the pixel capacitance 103 is 0.2 pF, the additional capacitance 109 is 5 pF, and the parasitic capacitance 111 is 15 pF, when a voltage of 5 V is inputted from the external terminal 120 as an inspection signal to apply the pixel capacitance 103 with a signal charge, a change in the potential detected from the external terminal 120 is 50 mV per pixel, which is extremely small.

Since the signal charge applied to the pixel capacitance 103 has a small absolute value and thus the signal detected from the external terminal 120 is easily influenced by noise, it is difficult to ensure a sufficient S/N ratio.

The switches 112 and 116 which are externally provided have problems in that the input capacitance of the switches 112 and 116 is large compared with the pixel capacitance 103 and thus the level of the signal detected from the external terminal 120 is further lowered, and that a fluctuation in the potential of the external signal line 108 accompanied by the ON/OFF operation of the switches 112 and 116 is large.

Another problem concerns rubbing treatment. An active matrix substrate which has been judged satisfactory or which has been subjected to correction is sent to a process of forming an image forming section of the liquid crystal display device. In this process, rubbing treatment is performed to align liquid crystal molecules as a display medium. For such rubbing treatment, an alignment film of polyimide or the like formed on the active matrix substrate is rubbed by a cloth, which generates a large amount of static electricity, Static electricity may be generated in other processes for producing a liquid crystal display device such as a coating process and a seal printing process. If such a process for producing a liquid crystal display device is performed after the above-described electrical inspection, the pixel transistors 104 are possibly broken by the large amount of static electricity, resulting in an increase in defects.

SUMMARY OF THE INVENTION

An active matrix substrate according to the present invention includes a plurality of pixel electrodes arranged in a matrix; a plurality of data lines for supplying video signals to the pixel electrodes; a plurality of scanning lines for supplying scanning signals for selecting at least one of the pixel electrodes which is to be supplied with the video signals; and an external signal supplying circuit for externally supplying the video signals to the data lines. The external signal supplying circuit includes a data line connection section connected to the data lines; an inspection signal inputting section and an inspection signal outputting section both connected to the data line connection section; and a switching device for electrically connecting one of the inspection signal inputting section and the inspection signal outputting section to the data line connection section.

In a preferred embodiment of the invention, the inspection signal inputting section includes an inspection signal inputting terminal, and a first switching element provided between the inspection signal inputting terminal and the data line connection section; and the inspection signal outputting section includes an inspection signal outputting terminal, a second switching element provided between the data line connection section and the inspection signal outputting terminal, and a signal amplifying circuit provided between the inspection signal outputting terminal and the second switching element.

In a preferred embodiment of the invention, the active matrix substrate further includes a source driving circuit including a first terminal for controlling the supply of the video signal from the data lines; and a gate driving circuit including a second terminal for controlling the supply of the scanning signal from the scanning lines.

A method for inspecting an active matrix substrate according to the present invention includes the steps of electrically connecting an inspection signal inputting section to a data line connection section through a switching device so as to supply an inspection signal to the data line connection section from the inspection signal inputting section; electrically connecting an inspection signal outputting section to the data line connection section through the switching device so as to detect a signal from the inspection signal outputting section; and analyzing the signal detected from the inspection signal outputting section so as to judge if the active matrix substrate has a defect.

A preferred embodiment of the invention further includes the steps of forming a short ring for electrically connecting an inspection signal inputting terminal, an inspection signal outputting terminal, a first terminal, a second terminal, and the data line connection section, in a case when the active matrix substrate is judged to have no defect; and removing the short ring after an alignment treatment of a display medium.

According to the present invention, an inspection signal outputting section is provided with a signal amplifying circuit. In such a configuration, a signal is sent in the state of being amplified to an external circuit which is easily influenced by noise. Such an operation realizes small influence of noise and signal measurement with a high S/N ratio. Further, since the input capacitance of a second switching element is smaller compared with the case where a switch is externally provided, the level of the detected signal is not influenced by the capacitance.

A first switching element and the second switching element may have an n-type TFT (thin film transistor) and a p-type TFT in which a source electrode of the n-type TFT is connected to a source electrode of the p-type TFT, a drain electrode of the n-type TFT is connected to a drain electrode of the p-type TFT, and a gate electrode of the p-type TFT receives a signal obtained by inverting a signal inputted to a gate electrode of the n-type TFT. In such a case, when each switching element is turned off, the potential fluctuation caused by the parasitic capacitance between the source electrode and the drain electrode of the n-type TFT and the potential fluctuation caused by the parasitic capacitance between the source electrode and the drain electrode of the p-type TFT cancel each other, and thus a fluctuation in the potential of the external signal line is reduced to a minimum extent. Thus, signal measurement with a high S/N ratio is possible.

After the inspection, a short ring may be provided for shortcircuiting all scanning lines, all data lines, an inspection signal inputting terminal, an inspection signal outputting terminal, a first terminal provided with a source driving circuit, a second terminal provided with a gate driving circuit, a data line connection section, and all other terminals provided on a base panel. In such a case, damage to the active matrix substrate caused by the static electricity in a process for forming an image forming section of a liquid crystal display device can be prevented, thereby improving the yield.

Thus, the invention described herein makes possible the advantages of providing an active matrix substrate and a method for inspecting the same, according to which signal charges can be measured with a high S/N ratio with little influence of noise, a fluctuation in the potential of an external signal line accompanied by the ON/OFF operation of switches can be reduced to a minimum extent, and switching devices are not broken by a process for producing a liquid crystal display device such as rubbing treatment performed after an electrical inspection.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the accompanying drawings.

Figure 1:
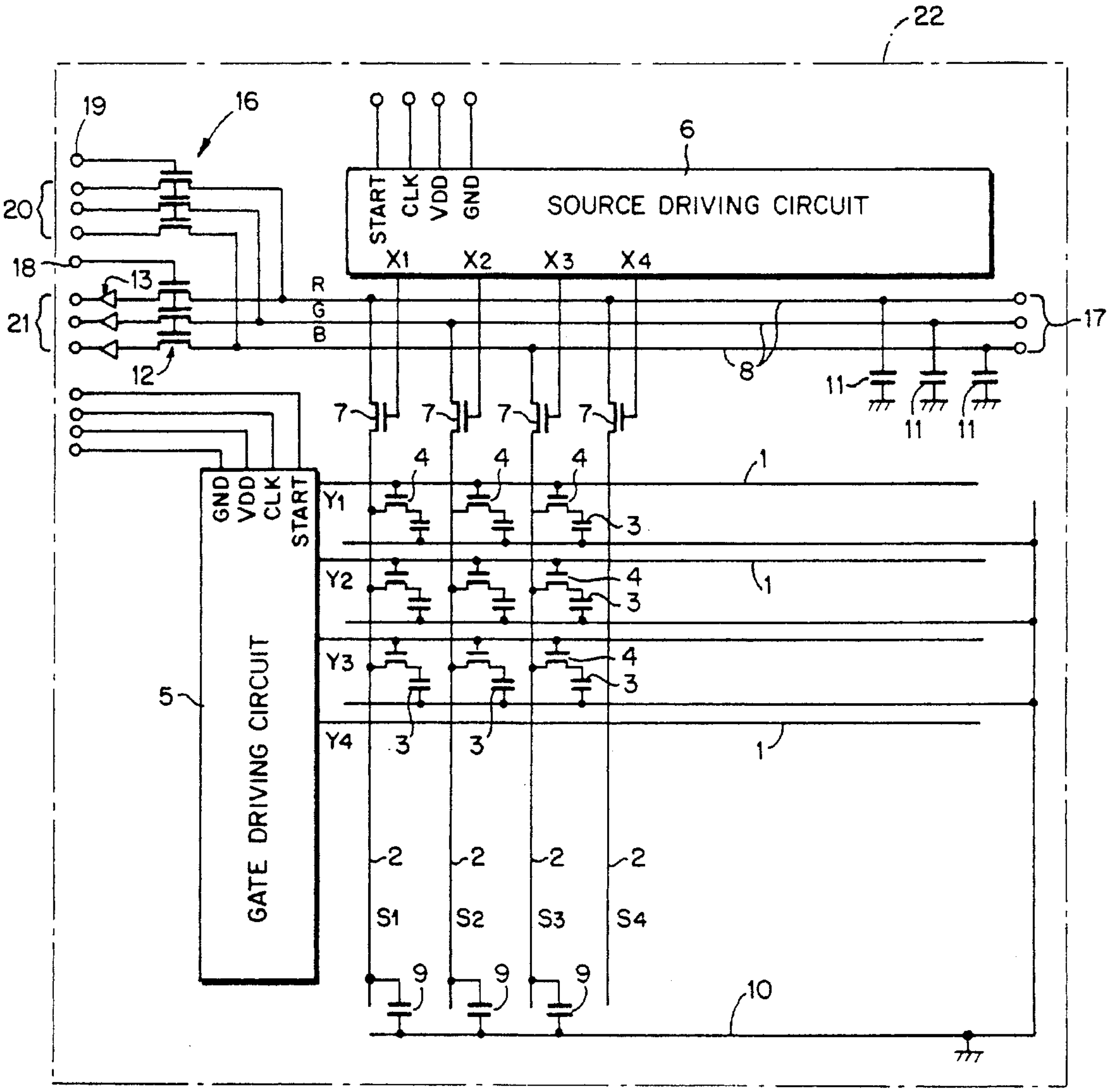
FIG. 1 is a block diagram of an active matrix substrate according to an example of the present invention.

FIG. 1 shows a configuration for an active matrix substrate according to an example of the present invention.

The active matrix substrate shown in FIG. 1 includes a base panel 22, gate bus lines 1 provided on the base panel 22 in the number of n, each corresponding to a row, and source bus lines 2 provided on the base panel 22 in the number of m, each corresponding to a column. In this example, m is a multiple of 3. The gate bus lines 1 and the source bus lines 2 intersect each other. Each intersection has a pixel capacitance 3 and a pixel transistor 4. In this manner, a plurality of the pixel capacitances 3 and a plurality of the pixel transistors 4 are arranged in a matrix, respectively. Each pixel transistor 4 has a gate electrode connected to the corresponding gate bus line 1, a source electrode connected to the corresponding source bus line 2, and a drain electrode connected to the corresponding pixel capacitance 3. Each pixel capacitance 3 is provided for retaining a video signal supplied thereto through the pixel transistor 4 as a signal charge.

The gate bus lines 1 are each connected to and also driven by a gate driving circuit 5. Among the pixel transistors 4 arranged in a matrix, one row of the pixel transistors 4 is connected to an identical gate bus line 1 and the pixel transistors 4 thereof are simultaneously controlled to be on or off by the gate driving circuit 5. The gate driving circuit 5 is constituted by a shift register formed on the base panel 22, and is driven by an external power source and controlled by a start signal, a clock signal or the like externally supplied.

Each source bus line 2 is connected to either one of three external signal lines 8 through an analog switch 7 which is controlled to be on or off by a source driving circuit 6. In this example, the left-most source bus line 2 is connected to the external signal line 8 for red, the second source bus line 2 from the left is connected to the external signal line 8 for green, and the third source bus line 2 from the left is connected to the external signal line 8 for blue. The other source bus lines 2 are arranged in the same manner.

Among the pixel transistors 4 arranged in the matrix, one column of the pixel transistors 4 is connected to an identical source bus line 2. In this manner, the source bus lines 2 are each connected to one column of the pixel capacitances 3 through the corresponding pixel transistors 4. In detail, each pixel capacitance 3 is connected to the corresponding pixel transistor 4 through one of two electrodes of the pixel capacitance 3. The source bus lines 2 are each connected to an additional capacitance 9 through one of two electrodes of the additional capacitance 9. The other electrode of the additional capacitance 9, which is not connected to the source bus line 2, and the other electrode of the pixel capacitance 3, which is not connected to the pixel transistor 4, are both connected to a wiring 10 and have an identical reference potential with each other.

In a case where the active matrix substrate is used for a liquid crystal display device, the three external signal lines 8 receive red, green and blue video signals, respectively, through an external terminal 17 provided at an end of each thereof. If each analog switch 7 is on at this point, the video signal received is sent to the corresponding source bus line 2. Each of the three external signal lines 8 also has another external terminal 20 at the other end thereof. Each external signal line 8 further has a switch 16 at a position between the external terminal 20 and one of connection points of the external signal lines 8 and the source bus lines 2, the one being closest to the external terminals 20. The switch 16 is formed on the base panel 22 and is controlled to be on or off by a control signal inputted from an external terminal 19.

Each of the external signal lines 8 has a branch line which is branched at a branch point between the switch 16 and the connection point of the external signal line 8 and the source bus line 2 closest to the external terminal 20. Each branch line has an external terminal 21 at an end thereof. Each branch line further has a switch 12 between the branch point and the external terminal 21. Each branch line still further has a buffer circuit 13 between the switch 12 and the external terminal 21. The switch 12 and the buffer circuit 13 are formed on the base panel 22. The switch 12 is controlled to be on or off by a control signal inputted from an external terminal 18. A parasitic capacitance 11 is generated at each external signal line 8. The additional capacitance 9 retains a video signal on the source bus line 2.

A portion of each external signal line 8 between the branch point and the external terminal 17 is referred to as a data line connection section. In this example, the switches 12 and 15 are each constituted by a MOSFET (metal-oxide-semiconductor field effect transistor) having a semiconductor layer formed of polysilicon or single crystalline silicon, but not limited to such a construction.

The source driving circuit 6 is constituted by a shift register formed on the base panel 22, and is driven by an external power source and controlled by a start signal, a clock signal or the like externally supplied.

Figure 2:
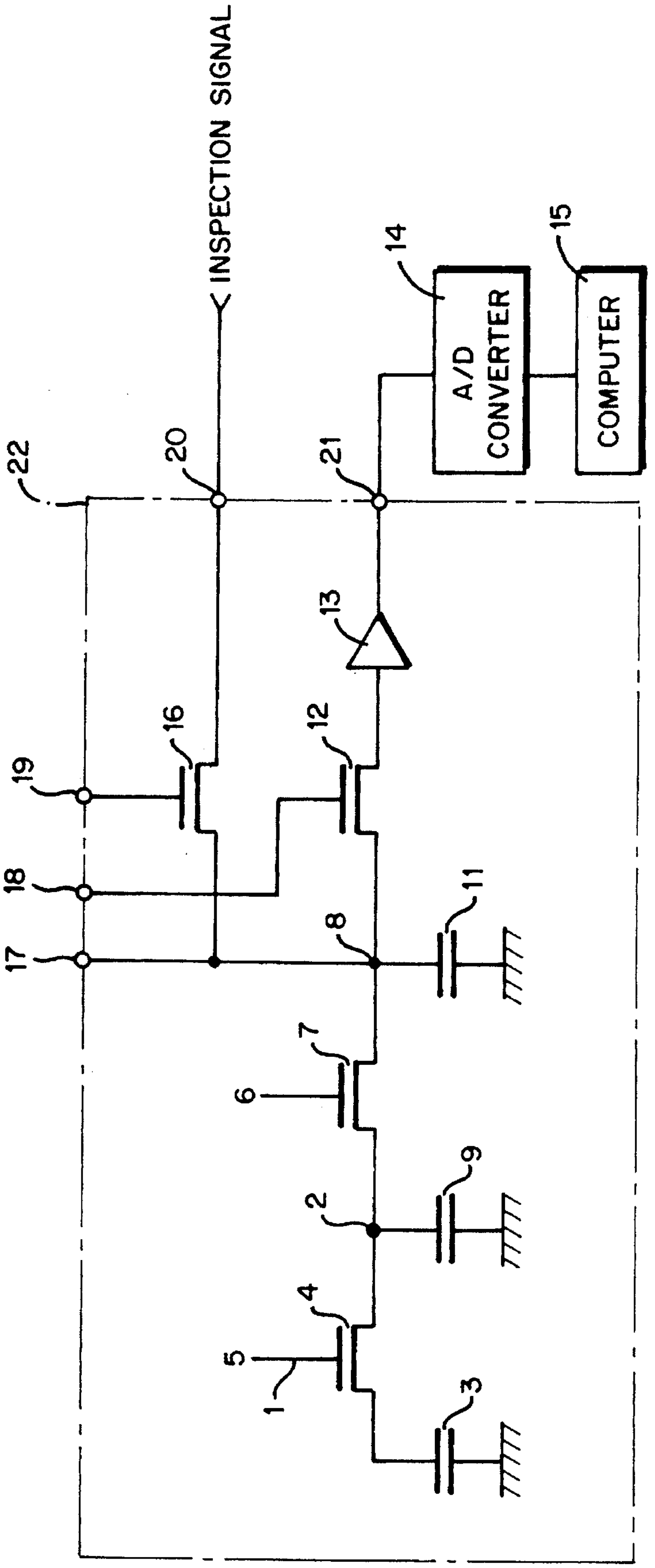
FIG. 2 is an equivalent circuit diagram for applying a charge corresponding to an inspection signal to one pixel capacitance of the active matrix substrate shown in FIG. 1 and detecting the level of the signal from the pixel capacitance.

An active matrix substrate having the above-described configuration is electrically inspected concerning the operation of each pixel by use of a built-in system shown in FIG. 2.

FIG. 2 is an equivalent circuit diagram for applying a charge corresponding to an inspection signal to one pixel capacitance and detecting the level of the signal from the pixel capacitance.

As is shown in FIG. 2 and also described above, each pixel capacitance 3 is connected to the source bus line 2 through the pixel transistor 4 controlled by the gate bus line 1. The source bus line 2 has the additional capacitance 9. The source bus line 2 is connected to the external signal line 8 through the analog switch 7 controlled by the source driving circuit 6. The external signal line 8 has the parasitic capacitance 11.

The external signal line 8 has the external terminal 17 for inputting a video signal and further the switches 12 and 16. The switch 16 is controlled to be on or off by a control signal inputted through the external terminal 19. When the switch 16 is on, the external terminal 20 connected to one of two sides of the switch 16 and the external signal line 8 connected to the other side of the switch 16 are conductive to each other. In this state, an inspection signal can be supplied to the external signal line 8 through the external terminal 20. The switch 12 is controlled to be on or off by a control signal inputted through the external terminal 18. When the switch 12 is on, the buffer circuit 13 connected to one of two sides of the switch 12 and the external signal line 8 connected to the other side of the switch 12 are conductive to each other. In this state, a signal can be detected at the external terminal 21 in the state of being amplified through the buffer circuit 13. The detected signal is A/D converted by an A/D converter 14 to be processed by a computer 15.

An inspection of the operation of the pixel is performed in the following manner. The external terminal 17 is connected to no external apparatus. Here, the explanation will be done using the external signal line 8 for red as an example, but the procedure is identical for the other external signal lines 8 for green and blue.

Figure 3:
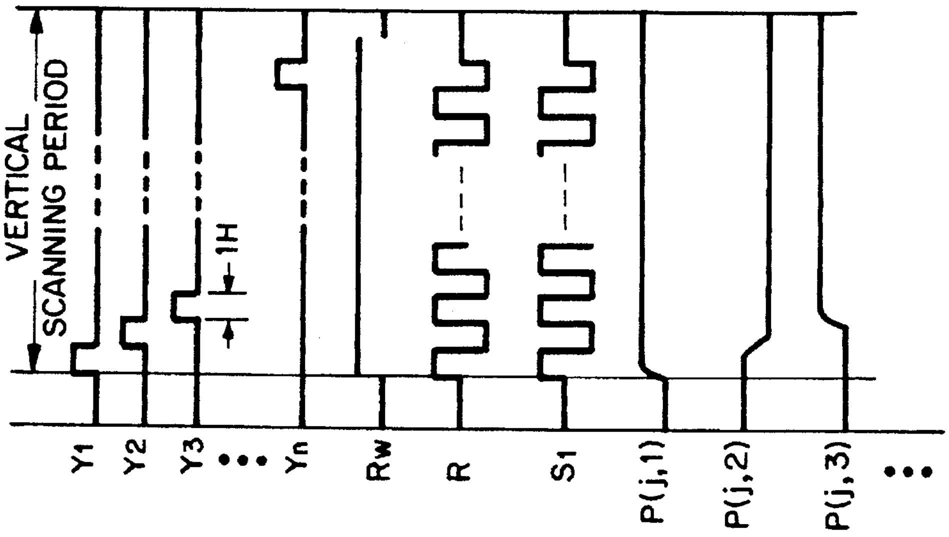
FIG. 3 is a timing chart of a vertical scanning period for applying an inspection signal to a pixel capacitance of the active matrix substrate shown in FIG. 1.

As is shown in FIG. 3, when a control signal $R_W$ becomes high, the switch 16 is turned on, thereby inputting an inspection signal R to the external terminal 20.

Figure 4:
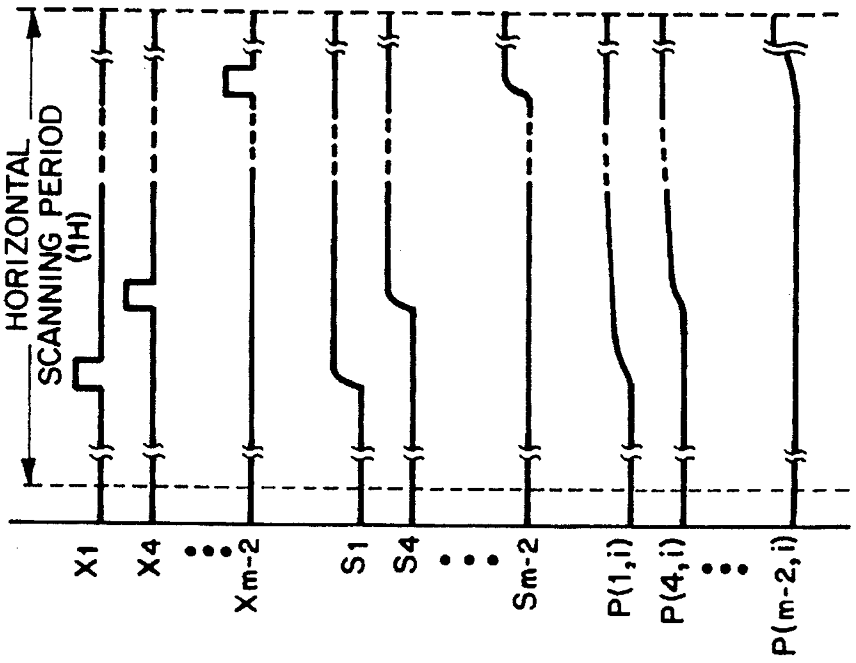
FIG. 4 is a timing chart of a horizontal scanning period for applying an inspection signal to a pixel capacitance of the active matrix substrate shown in FIG. 1.

Next, the gate driving circuit 5 is driven to sequentially send gate signals $Y_1$ through $Y_n$ to the gate bus lines 1. The gate signals $Y_1$ through $Y_n$ are kept high only for one horizontal scanning period (1H). The operation for one horizontal scanning period will be described with reference to FIG. 4. During the horizontal scanning period, the source driving circuit 6 is driven to sequentially send control signals $X_1$ through $X_m$ to the analog switches 7, thereby turning on the analog switches 7. In FIG. 4, only every third signal is shown since the explanation concerns only the external signal line 8 for red. When the analog switches 7 are on, the source bus lines 2 are applied with additional capacitances 9 ($S_1$ through $S_{m-2}$) by an inspection signal. At this point, one row of the pixel transistors 4 (the ith row) which is connected to either one of the gate bus line 1 intersecting the source bus lines 2 have already been turned on. Accordingly, the pixel capacitances 3 expressed by P(1, i) through P(m-2, i) corresponding to the above row of the pixel transistors 4 are also applied with a signal charge. (The pixel capacitance 3 F(l, k) is connected to the pixel transistor 4 which is connected to the kth gate bus line 1 and the lth source bus line 2.) As is shown in FIG. 4, when the analog switches 7 are turned on, the source bus lines 2 are immediately applied with the additional capacitance 9 ($S_1$ through $S_{m-2}$). In contrast, the application of the signal charge to the pixel capacitances 3 (P(1, i) through P(m-2, i)) is continued even after the analog switches 7 are turned off since the time constant for such application is long. Under such circumstances, in order to have sufficient time for application of a signal charge to the last pixel capacitance 3 to be applied therewith within one horizontal scanning period, sufficient time is provided before the source driving circuit 6 sends the first control signal to the source bus line 2 during each horizontal scanning period and after the source driving circuit 6 sends the last control signal to the source bus line 2 during each horizontal scanning period.

When gate signals $Y_1$ through $Y_n$ are sent to all the gate bus lines 1 in this manner and thus scanning for one vertical scanning period is finished, the charging operation is completed.

Figure 5:
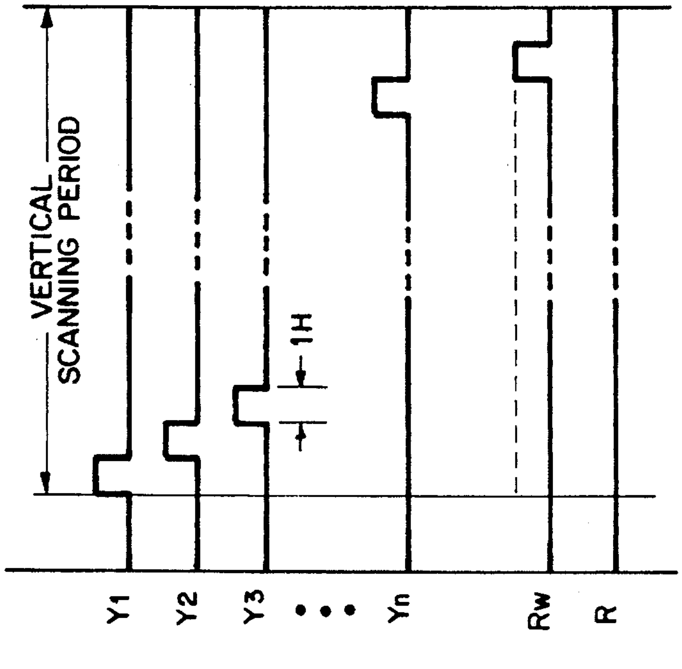
FIG. 5 is a timing chart of a vertical scanning period for detecting a signal in the active matrix substrate shown in FIG. 1.

After all the pixel capacitances 3 are applied with a signal charge and keep the signal charge for a certain period of time, the switch 12 is turned on to output the signal to the buffer circuit 13. At this point, the switch 16 is off. Then, as is shown in FIG. 5, the gate driving circuit 5 is driven to sequentially send gate signals $Y_1$ through $Y_n$ to the gate bus lines 1. The gate signals $Y_1$ through $Y_n$ are kept high only for one horizontal scanning period (1H). Then, the pixel transistors 4 connected to each gate bus line 1 which has received the gate signal are turned on. In this state, the signal charges kept in the pixel capacitances 3 are sent to the source bus lines 2. During the horizontal scanning period, the source driving circuit 6 is driven to sequentially send control signals $X_1$ through $X_{m-2}$ to the analog switches 7, thereby turning on the analog switches 7. Then, the signals sent to the source bus lines 2 from the pixel capacitances 3 are further sent to the external signal line 8 through the analog switches 7 and still further sent to the buffer circuit 13 through the switch 12. The signals are amplified by the buffer circuit 13 to be signals $R_r$, which are A/D converted to digital signals by the A/D converter 14 and are inputted to the computer 15. In other words, the signals $R_r$ are obtained by sequentially detecting the level of the signals corresponding to the signal charges kept in the pixel capacitances 3.

Figure 6:
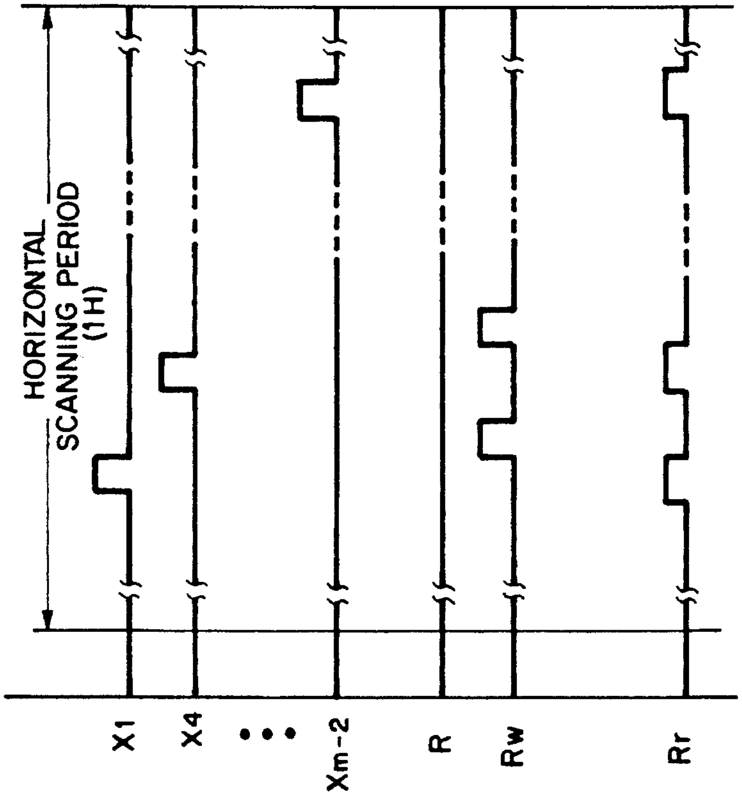
FIG. 6 is a timing chart of a horizontal scanning period for detecting a signal in the active matrix substrate shown in FIG. 1.

The computer 15 sequentially stores the signals $R_r$ in specified memories. Further, the computer 15 compares each signal $R_r$ with a specified pattern to judge if there is any defect in the gate driving circuit 5, the source driving circuit 6, the gate bus lines 1, the source bus lines 2, the pixel capacitances 3, the pixel transistors 4, the analog switches 7, and the external signal lines 8 for transmitting the signals, and the like. In a case where no abnormality is generated in the operation of the gate driving circuit 5, the source driving circuit 6, the pixel capacitances 3, the pixel transistors 4, and the analog switches 7, and further no disconnection and other malfunction is found in the gate bus lines 1, the source bus lines 2 and the external signal lines 8, the signal $R_r$ is detected to have ideal periodical pulses as is shown in FIG. 6. In such a case, the active matrix substrate can be judged normal. In a case where the active matrix substrate is judged to have defect, the position and the type of the defect can be specified to some extent from the timing and the distribution shape of the pulses of the signal $R_r$. For example, in a case where one pixel transistor 4 or one pixel capacitance 3 is abnormally operated, the signal $R_r$ lacks one of the pulses at a position corresponding to the defective pixel transistor 4 or pixel capacitance 3, the pulses being sequentially generated. From such a phenomenon, the abnormality can be detected. By specifying the position where the signal $R_r$ lacks a pulse, it can be determined which pixel transistor 4 or pixel capacitance 3 is defective. In a case where the signal $R_r$ lacks pulses corresponding to the pixel transistors 4 or pixel capacitances 3 belonging to a certain row, it can be judged that the gate bus line 1 of that row or the gate driving circuit 5 for selecting the gate bus line 1 is defective. In a case where the signal $R_r$ lacks pulses corresponding to the pixel transistors 4 or pixel capacitances 3 belonging to a certain column, it can be judged that the source bus line 2, the analog switch 7 both corresponding to that column or the source driving circuit 6 for selecting the source bus line 2 is defective.

In the active matrix substrate in this example, every third control signals $X_1$ through $X_{m-2}$ for controlling the analog switches 7 to be on or off are outputted sequentially for the each external signal line 8. Accordingly, there is an interval between two consecutive signals for each external signal line 8. By turning on the switch 16 and supplying a reference potential to the external terminal 20 during every such interval, the signal remaining at the parasitic capacitance 11 of the external signal line 8 can be erased.

By extending one horizontal scanning period, the signal remaining at the additional capacitance 9 of the source bus line 2 can be erased.

The buffer circuit 13 may be constituted by a circuit such as an operation amplifier or a source follower using a TFT. By constituting the buffer circuit 13 so as to have an input impedance which is smaller than the pixel capacitance 3 and a voltage gain which is 1 or more, preferably, which is larger than the ratio of the additional capacitance 9 with respect to the pixel capacitance 3, a highly precise inspection can be performed.

As has been described thus far, according to the present invention, the switches 12 and 16 for controlling the input and the output of an inspection signal to and from the external signal line and the buffer circuit 13 are formed on the base panel 22. Due to such a configuration, influence of noise can be reduced and thus signal measurement with a high S/N ratio is realized, thereby improving the inspection precision.

According to the above-described inspection method, a cycle of signal measurement requires only two vertical scanning periods, namely, one several tenths of a second in a case when, for example, a liquid crystal display device having 100,000 pixels is actually operated at an operating frequency.

In an actual active matrix substrate according to the present invention, the pixel capacitance 3 is approximately 0.2 pF, the additional capacitance 9 of the source bus line 2 is approximately 5 pF, and the parasitic capacitance 11 of the external signal line 8 is approximately 15 pF. In this state, when an inspection signal R of 5 V is inputted from the external terminal 20 to apply the pixel capacitance 3 with a signal charge, the signal $R_r$ detected at the external terminal 21 is 50 mV. Although it is possible to detect a complete disconnection or a complete leak, it is difficult to detect a small defect. Such an inconvenience is solved by repeating the above-described procedure of applying a charge corresponding to an inspection signal R to one pixel capacitance 3 and detecting the level of the signal $R_r$ from the pixel capacitance 3. For example, 10 to 100 times and then summing signals detected from an identical pixel capacitance 3. In this manner, the S/N ratio is further improved, thus to make it possible to detect a defect which is caused by a leak or the like having a time constant which is approximately the same or lower than that of the driving timing in the above-described procedure as well as a defect such as a complete disconnection or a shortcircuit.

According to the above-described method, a repetition thereof by 10 to 100 times requires only several seconds.

Figure 7:
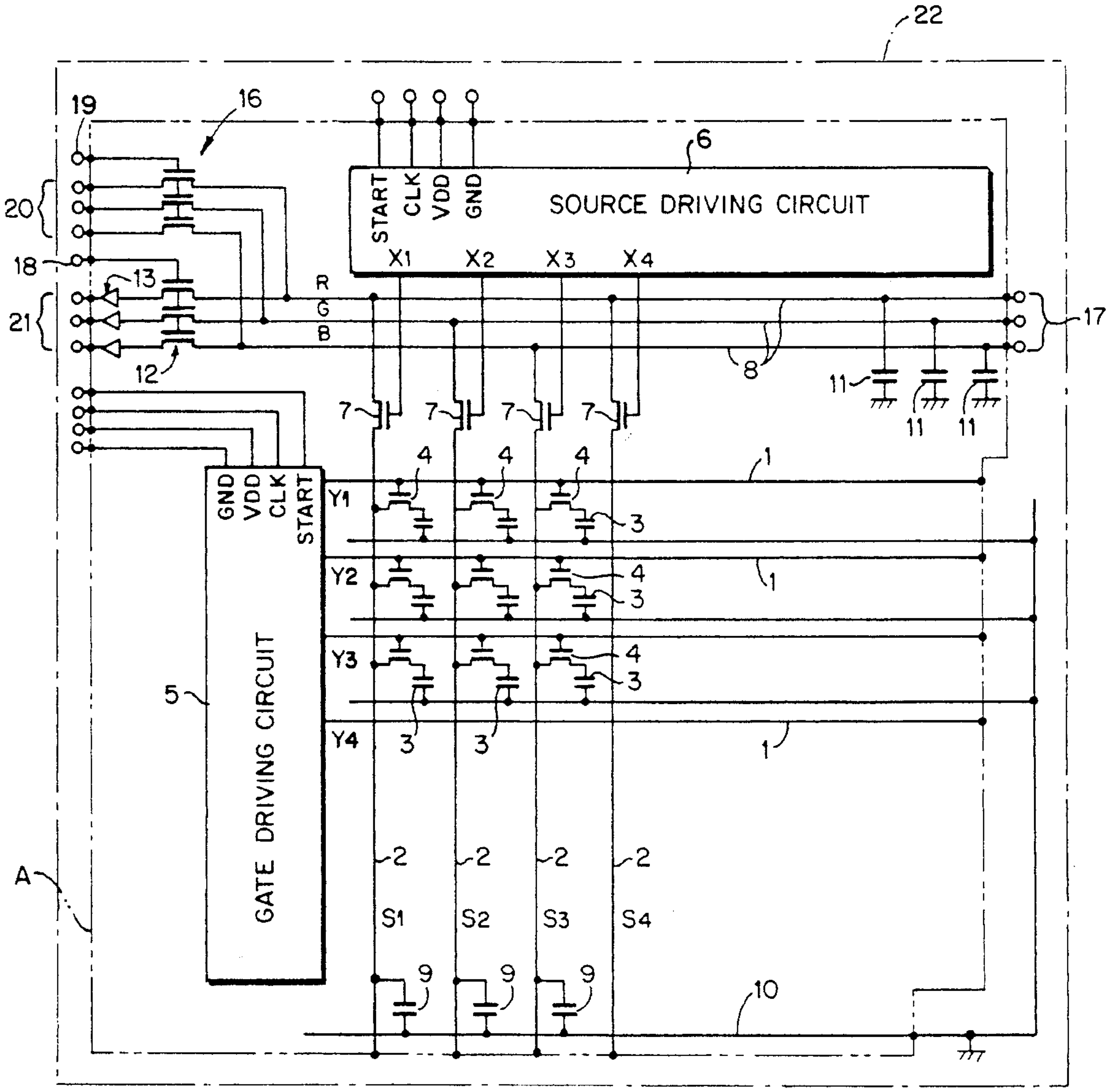
FIG. 7 is a block diagram of the active matrix substrate shown in FIG. 1 in the state of being connected to a short ring A.
Figure 10:
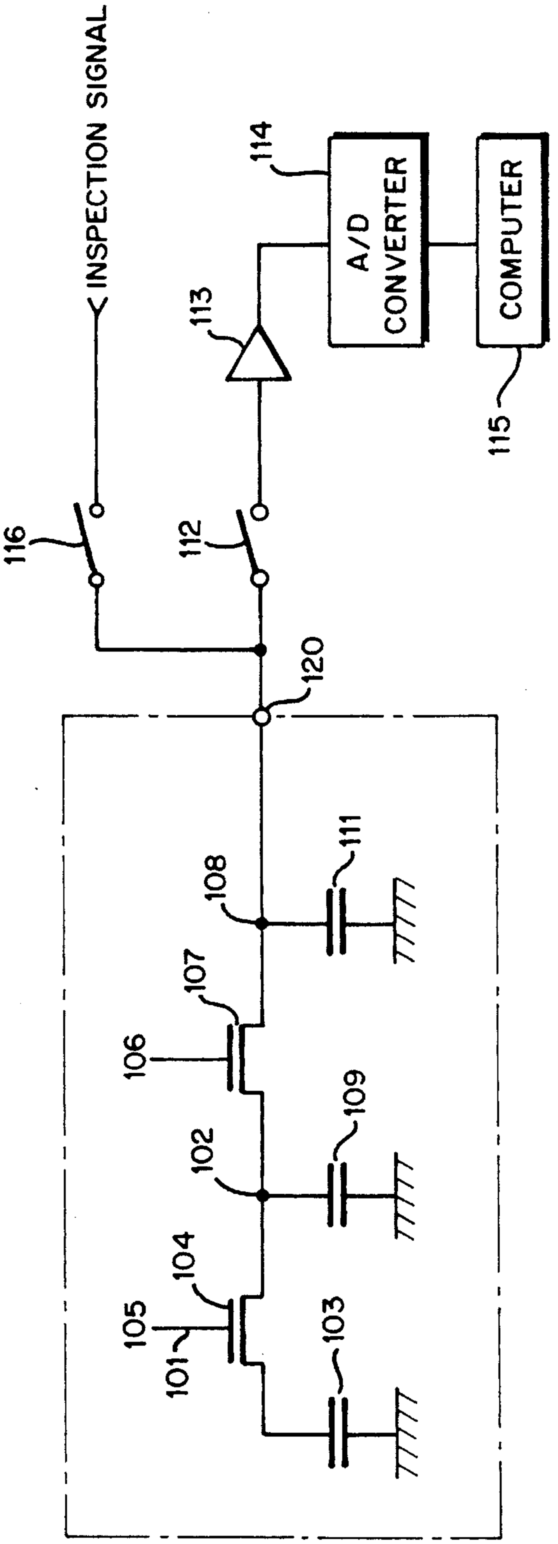
FIG. 10 is an equivalent circuit diagram for applying a charge corresponding to an inspection signal to one pixel capacitance shown in FIG. 9 and detecting the level of the signal from the pixel capacitance.

For performing the above-described electrical inspection, the gate bus lines 1, the source bus lines 2, the external terminals 17, 18, 19, 20 and 21, all terminals provided with the gate driving circuit 5 and with the source driving circuits 6, and all other terminals provided on the base panel 22 are not electrically shortcircuited to one another. In a case where a process for producing a liquid crystal display device such as rubbing treatment is performed to form an image forming section of the liquid crystal display device in this state, the pixel transistors 4 are possibly broken by the effect of static electricity. Such a phenomenon results in a significant decline in the yield. In order to avoid such a phenomenon from occurring, a short ring A is provided as is shown in FIG. 7 for electrically shortcircuiting all the gate bus lines 1, all the source bus lines 2, the external terminals 17, 18, 19, 20 and 21, all the terminals provided with the gate driving circuit 5 and with the source driving circuit 6, and all other terminals provided on the base panel 22. In a case where a transparent conductive film formed of, for example, ITO (indium tin oxide) is used for the short ring A, the short ring A and the pixel electrode of the pixel capacitances 3 can simultaneously be formed. After the short ring A is formed and then a process for producing a liquid crystal display device such as rubbing treatment is performed, the short ring A is removed to complete the active matrix substrate.

In this example, the inspection signal R for applying the pixel capacitances 3 with signal charges is an AC pulse signal which is inverted each horizontal scanning period, and each time one column of the pixel capacitances 3 are applied with the signal charges, the signals are retained in the pixel capacitances 3. The present invention is not limited to such a process. The timing at which an AC pulse signal is inverted is not limited to one horizontal scanning period. Alternatively, for example, a constant inspection signal R is used to apply all the pixel capacitances 3 with signal charges and then the retaining operation is performed, thereafter the signal $R_r$ is detected.

In this example, the active matrix substrate has a plurality of external signal lines 8 so as to remove a signal remaining at the parasitic capacitances 11 thereof within the interval between two consecutive signals. The present invention is not limited to such a configuration, but any other configuration may be applied as long as a signal remaining at the parasitic capacitance 11 can be removed. The external signal lines 8 can be provided in any other number as well as three.

In the equivalent circuit shown in FIG. 2, a switch for refreshing a potential may be provided between each source bus line 2 and the ground. Such a switch may be formed of a MOSFET as the switches 12 and 16.

In this example, the gate bus lines 1 are linear and parallel to one another and the source bus lines 2 are also linear and parallel to one another. The present invention is not limited to such a configuration, but any other configuration may be applied as long as the gate bus lines 1 are driven by the gate driving circuit 5 and the source bus lines 2 are driven by the source driving circuit 6. The number of the source bus lines 2 are not necessarily a multiple of 3.

In this example, the terminals 17, 18, 19, 20 and 21, all the terminals provided with the gate driving circuit 5 and with the source driving circuit 6 are connected to the short ring A. All the gate bus lines, all the scanning lines and all other terminals provided on the base panel 22 may be connected to the short ring A. The present invention is not limited to such a configuration, but any point of each lines on which the each above-mentioned terminals is provided may be connected to the short ring A in stead of the each above-mentioned terminals.

Figure 8:
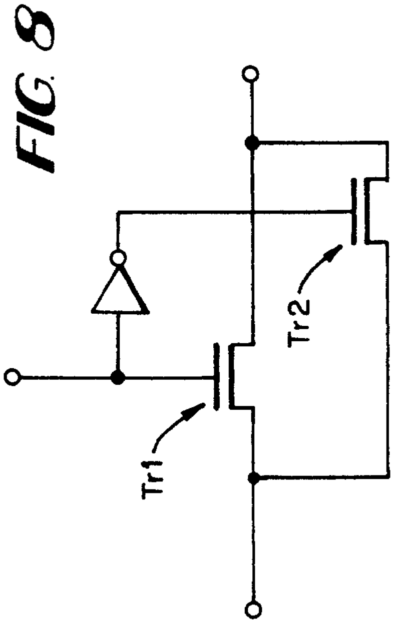
FIG. 8 is a configuration diagram of a switch according to another example of the present invention.
Figure 9:
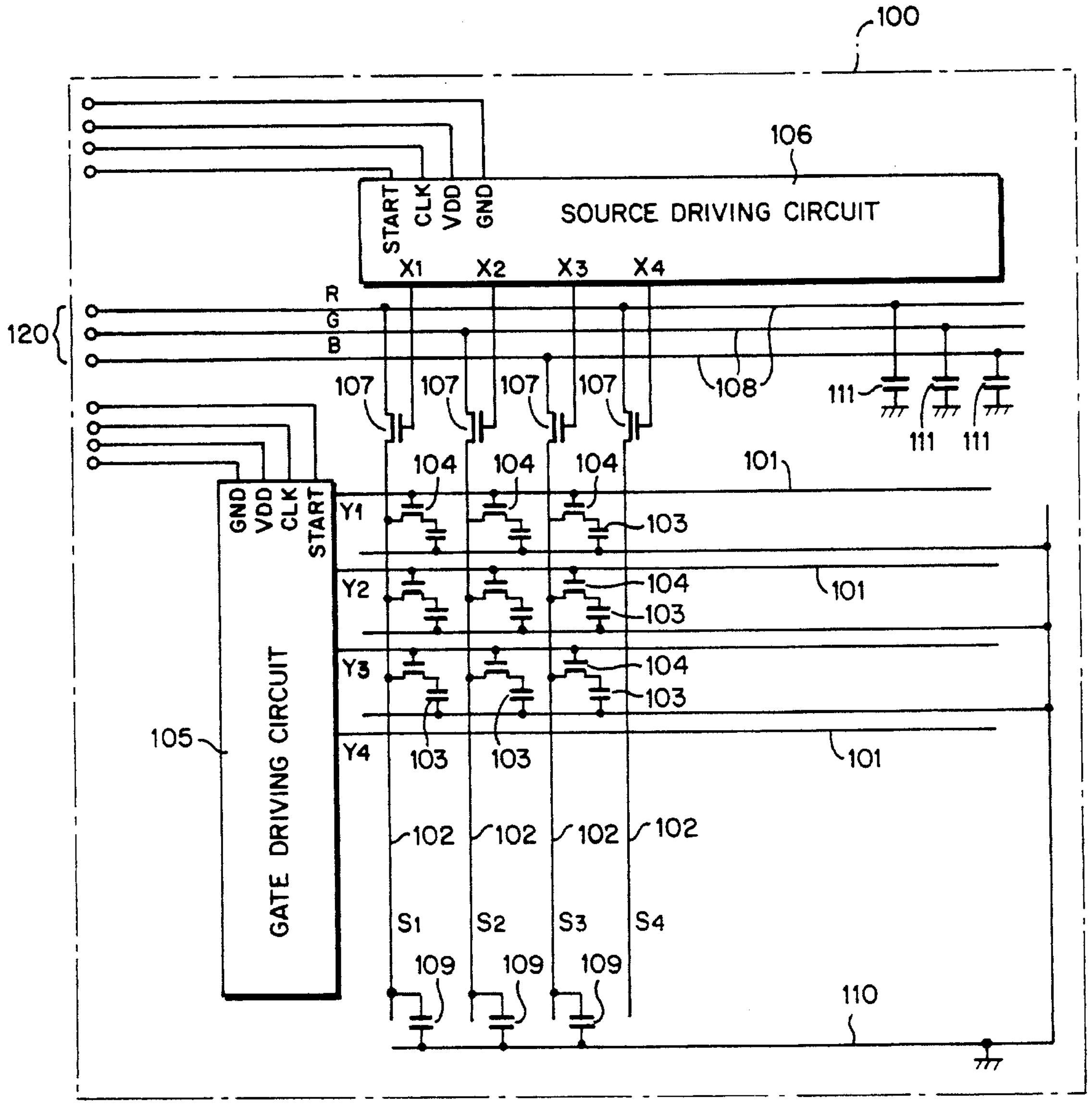
FIG. 9 is a block diagram of a conventional active matrix substrate.

FIG. 8 shows a configuration of each of the switches 12 and 16 according to another example of the present invention.

The switches 12 and 16 may each have an n-type TFT Tr1 and a p-type TFT Tr2. A source electrode of the n-type TFT Tr1 is connected to a source electrode of the p-type TFT Tr2; and a drain electrode of the n-type TFT Tr1 is connected to a drain electrode of the p-type TFT Tr2. A gate electrode of the p-type TFT Tr2 receives a signal obtained by inverting a signal inputted to a gate electrode of the n-type TFT Tr1. The TFT Tr1 may be of p-type, in the case of which the TFT Tr2 is of n-type. When the switch 12 or 16 having such a configuration is turned off, the potential fluctuation caused by the parasitic capacitance between the source electrode and the drain electrode of the n-type TFT Tr1 and the potential fluctuation caused by the parasitic capacitance between the source electrode and the source electrode of the p-type TFT Tr2 cancel each other, and thus a fluctuation in the potential of the external signal line 8 is reduced to a minimum extent. Accordingly, the signal measurement can be performed with still higher precision.

Instead of the pixel transistors 4, transistors each having a semiconductor layer formed of polysilicon or single crystalline silicon may be used as switching devices. In such a case, a switching device having satisfactory characteristics with a high mobility can be produced in an identical process with that of the pixel transistor 4 and the analog switch 7.

In an active matrix substrate and a method for inspecting the active matrix substrate according to the present invention, the operation of the pixel transistors can be inspected with high reliability at a high speed as well as the operation of the driving circuits and the bus lines. Thus, a highly precise inspection can be possible. In a case where a defect is generated at a pixel (pixel transistor, pixel capacitance or the like), the position of the defect can be reliably detected. In a case where a defect is generated at a driving circuit or a bus line, the position of the defect can be assumed to some extent based on the distribution of abnormalities of the detected signal $R_r$. Moreover, since an inspection signal R is inputted to apply the pixel capacitance 3 with a signal charge, an efficient inspection can be performed for all the functions concerning the application operation of the signal charges with the pixel capacitances and the signal charge retaining operation by the pixel capacitances 3 and the pixel transistors 4.

Due to the switch and the buffer circuit provided to the external signal line, a signal can be amplified at a stage where the influence of noise is small. Accordingly, the S/N ratio at the inspection is improved so as to obtain a highly precise inspection. Further, since the input capacitance of the switch 12 for controlling the detection of the signal $R_r$ is smaller compared with the case where a switch is externally provided, the level of the detected signal is not influenced by the capacitance. In a case where the switches 12 and 16 each have an n-type TFT and a p-type TFT described above, the fluctuation in the potential of the external signal line 8 accompanied by the ON/OFF operation of the switches 12 and 16 is reduced to a minimum extent. Accordingly, the S/N ratio at the inspection is improved so as to obtain a highly precise inspection.

Due to the short ring A, the influence of the static electricity which is generated in the process for producing an image forming section of the liquid crystal display device can be reduced, thereby improving the yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active matrix substrate, comprising:

a plurality of pixel electrodes arranged in a matrix;

a plurality of data lines for supplying video signals to the pixel electrodes;

a plurality of scanning lines for supplying scanning signals for selecting at least one of the pixel electrodes which is to be supplied with the video signals; and external signal supplying means for externally supplying the video signals to the data lines;

wherein the external signal supplying means includes:

a data line connection section connected to the data lines, said data line connection section being on said substrate, an inspection signal inputting section connectable to a first connection to the data line connection section, and said inputting section receiving a sequence of test signals and sequentially applying the test signals via the data lines to impart capacitive charges to the electrodes, an inspection signal outputting section connectable to a second connection, separate from said first connection, to the data line connection section, and said outputting section receiving a sequence of signals via the data lines indicative of whether the charges were retained by each of the electrodes, and the outputting section including an amplifier for amplifying the sequence of signals; and a switching means for sequentially electrically connecting the inspection signal inputting section and then the inspection signal outputting section for each pixel electrode to the data line connection section, where said switching means is on the substrate.

2. An active matrix substrate according to claim 1, wherein:

the inspection signal inputting section includes an inspection signal inputting terminal, and a first switching element provided between the inspection signal inputting terminal and the data line connection section; and the inspection signal outputting section includes an inspection signal outputting terminal, a second switching element provided between the data line connection section and the inspection signal outputting terminal, and signal amplifying means provided between the inspection signal outputting terminal and the second switching element.

3. An active matrix substrate according to claim 2, further comprising:

source driving means including a first terminal for controlling the supply of the video signal from the data lines; and gate driving means including a second terminal for controlling the supply of the scanning signal from the scanning lines.

4. An active matrix substrate according to claim 3, wherein at least one of the first and the second switching elements is a MOSFET including a semiconductor layer, which is formed of a material selected from the group consisting of polysilicon and single crystalline silicon.

5. An active matrix substrate according to claim 2, wherein:

at least one of the first and the second switching elements includes an n-type TFT and a p-type TFT;

a source electrode of the n-type TFT is connected to a source electrode of the p-type TFT;

a drain electrode of the n-type TFT is connected to a drain electrode of the p-type TFT; and a gate electrode of the p-type TFT receives a signal obtained by inverting a signal inputted to a gate electrode of the n-type TFT.

6. An active matrix substrate according to claim 2, wherein at least one of the first and the second switching elements is a MOSFET including a semiconductor layer, which is formed of a material selected from the group consisting of polysilicon and single crystalline silicon.

7. An active matrix substrate according to claim 2, wherein the external signal supplying means includes at least one external signal supplying line for supplying a video signal to the corresponding data lines.

8. An active matrix substrate according to claim 7, wherein the external signal supplying means includes three external signal supplying lines for supplying red, green and blue video signals to the corresponding data lines.

9. An active matrix substrate according to claim 2, wherein the signal amplifying means is a buffer circuit.

10. An active matrix substrate according to claim 2, wherein:

the pixel electrodes are each connected to at least one of the scanning lines and at least one of the data lines through a third switching element;

the third switching element is an MOSFET including a semiconductor layer formed of a material selected from the group consisting of polysilicon and single crystalline silicon;

a source electrode of the third switching element is connected to the one of the data lines; and a gate electrode of the third switching element is connected to the one of the scanning lines.

11. A method for producing an active matrix substrate having a matrix of pixel electrodes interconnected with data and scan lines, a data line connection section operatively coupled to the data lines and a switch alternatively connecting inspection input and output signals, the method comprising the steps of:

electrically connecting an inspection signal inputting section on the substrate to the data line connection section via the switch to supply an inspection signal to the data line connection section from the inspection signal inputting section and to charge a selected pixel electrode;

electrically connecting an inspection signal outputting section on the substrate to the data line connection section via the switch to convey a pixel output signal from the data line connection section through the outputting section to an output terminal, where said pixel output signal is indicative of whether the selected pixel retained a charge;

amplifying the pixel output signal in the outputting section and on the substrate before the signal reaches the output terminal, and analyzing the signal detected from the inspection signal outputting section to ascertain whether the pixel retained the charge to detect defects in the active matrix substrate.

12. A method for producing an active matrix substrate according to claim 11, the method further comprising the steps of:

forming a short ring for electrically connecting said inspection signal inputting section, said inspection signal outputting section, a first terminal, a second terminal, and the data line connection section; and removing the short ring after an alignment treatment of a display medium.

13. A method for producing an active matrix substrate according to claim 12, wherein the short ring is formed of a transparent conductive ITO.

14. An active matrix substrate, comprising:

a plurality of pixel electrodes arranged in a matrix;

a plurality of data lines for supplying video signals to the pixel electrodes;

a plurality of scanning lines for supplying scanning signals to the pixel electrodes for selecting the pixel electrodes to be supplied with the video signals; and an inspection signal circuit section on the substrate connected to said data lines and to one or more external ports to the matrix, said ports receiving video signals for the data lines, wherein the inspection signal circuit section further comprises:

an inspection signal input circuit on the substrate connectable to the data lines and having one or more external inspection input ports for receiving inspection input signals, and one or more transistor switches electrically between the inspection input ports and the data lines for selectively connecting the inspection input ports to the data lines, wherein inspection signals are sequentially applied through the input circuit and the data lines to sequentially charge each of the pixel electrodes, an inspection signal output circuit on the substrate connectable to the data lines and having one or more external inspection output ports for sequentially outputting inspection output signals from the pixel electrodes, wherein each output signal is indicative of whether one of the pixel electrodes retained a charge, and one or more transistor switches electrically between the inspection output ports and the data lines for sequentially and selectively connecting the inspection output ports to the data lines, said output circuit further including one or more amplifiers amplifying the inspection output signals before the signals are output from the output ports.

15. An active matrix as in claim 14 wherein said amplifiers are positioned electrically between the switches and the output ports.

16. An active matrix as in claim 14 wherein the inspection signal input and output circuits each include three transistor switches, and each switch is operatively connected to one of said data lines, wherein said data lines receive RGB video signals.

17. An active matrix as in claim 14 wherein the inspection output circuit includes three amplifiers each operatively connected to one of said data lines, wherein said data lines receive RGB video signals.

* * * * *